United States Patent
Mori

(10) Patent No.: US 6,728,164 B2
(45) Date of Patent: Apr. 27, 2004

(54) FLASH MEMORY REWRITE CIRCUIT, SEMICONDUCTOR INTEGRATED CIRCUIT, MEMORY CARD HAVING THE SEMICONDUCTOR INTEGRATED CIRCUIT THEREOF, METHOD OF REWRITING FLASH MEMORY AND FLASH MEMORY REWRITING PROGRAM

(75) Inventor: Shuzo Mori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 10/253,531

(22) Filed: Sep. 25, 2002

(65) Prior Publication Data

US 2003/0058733 A1 Mar. 27, 2003

(30) Foreign Application Priority Data

Sep. 26, 2001 (JP) ........................................ 2001-294204

(51) Int. Cl.⁷ .............................................. G11C 16/06
(52) U.S. Cl. .............................. 365/238.5; 365/185.33; 365/185.08
(58) Field of Search .................. 365/238.5, 185.33, 365/185.08, 189.05

(56) References Cited

U.S. PATENT DOCUMENTS

| | | | | |
|---|---|---|---|---|
| 5,677,843 A | * | 10/1997 | Mizuno et al. ............. | 700/138 |
| 5,748,537 A | * | 5/1998 | Garbers et al. ........ | 365/185.33 |
| 5,847,997 A | * | 12/1998 | Harada et al. ......... | 365/185.33 |
| 6,005,810 A | * | 12/1999 | Wu ........................ | 365/185.33 |

FOREIGN PATENT DOCUMENTS

| JP | 2000-339212 | 12/2000 |
|---|---|---|
| JP | 2001-60167 | 3/2001 |

* cited by examiner

*Primary Examiner*—Richard Elms
*Assistant Examiner*—J. H. Hur
(74) *Attorney, Agent, or Firm*—Finnegan, Henderson, Farabow, Garrett & Dunner, L.L.P.

(57) ABSTRACT

A memory IC card including a card substrate, a semiconductor device mounted on the card substrate, which includes an CPU, a flash memory, a memory block and a flash memory rewrite circuit having a rewrite data control circuit that receives a rewrite instruction of the flash memory from the CPU to store data for a designated byte of a page for rewriting to the memory block, a page data control circuit that sends data of the page excepting the designated byte in the flash memory to the memory block to prepare new page data in the memory block and a data set control circuit that writes the new page data prepared in the memory block to the flash memory; outer terminals mounted on the card substrate; wirings provided on the card substrate to connect the outer terminals.

24 Claims, 10 Drawing Sheets

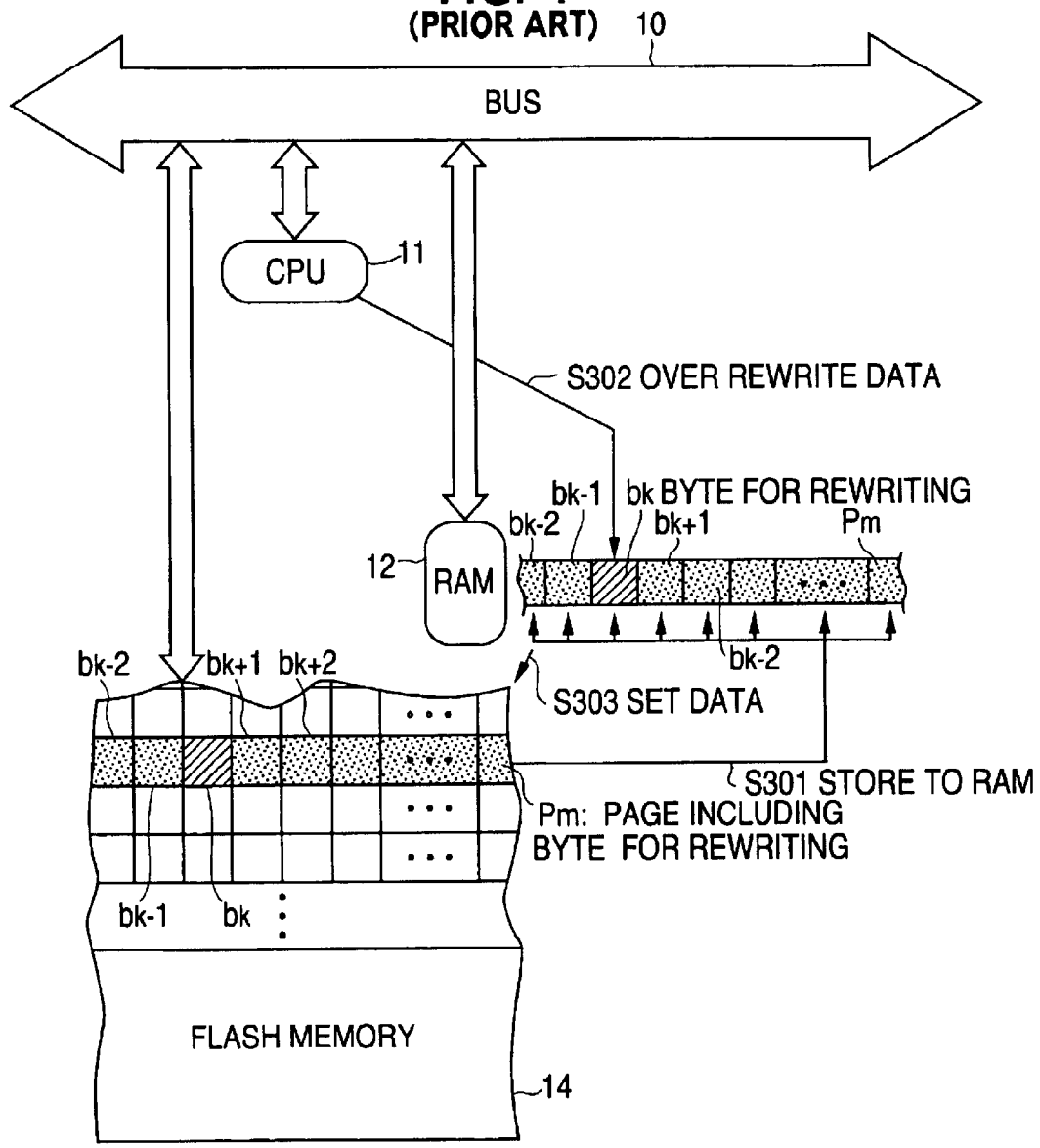

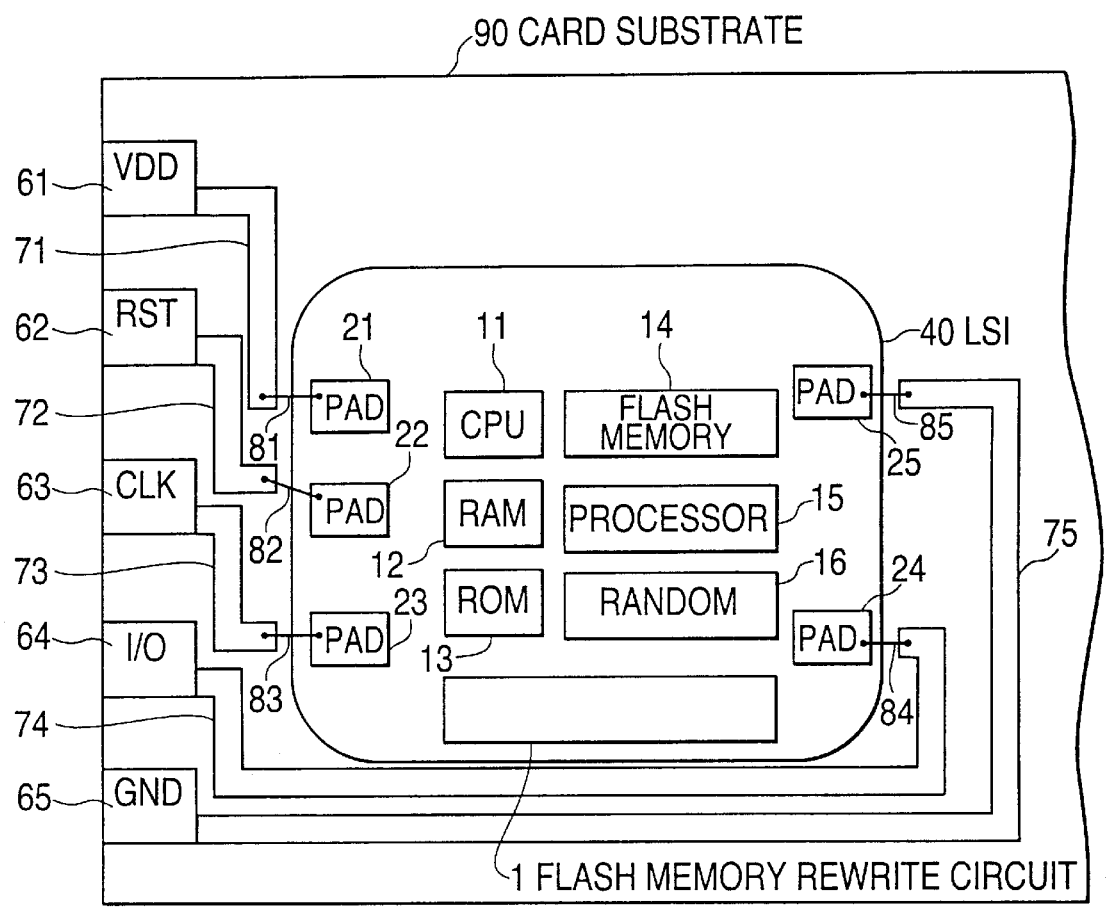
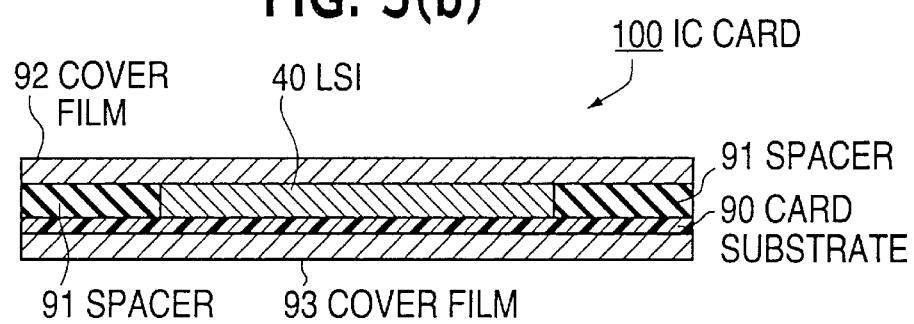

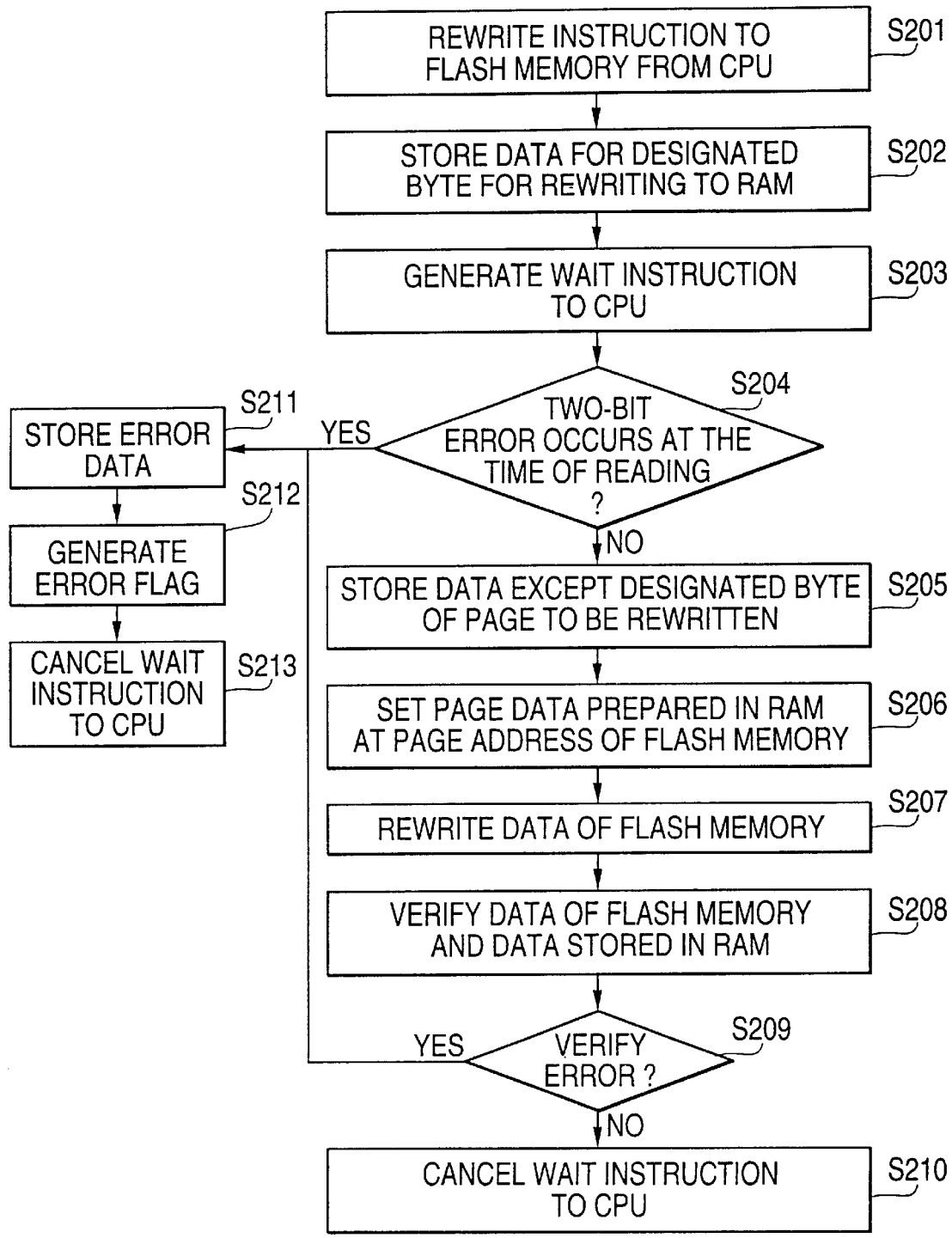

FLASH MEMORY REWRITE CIRCUIT, SEMICONDUCTOR INTEGRATED CIRCUIT, MEMORY CARD HAVING THE SEMICONDUCTOR INTEGRATED CIRCUIT THEREOF, METHOD OF REWRITING FLASH MEMORY AND FLASH MEMORY REWRITING PROGRAM

CROSS REFERENCE TO RELATED APPLICATIONS

This application claims the benefit of priority from prior Japanese Patent Application P2001-294204 filed on Sep. 26, 2001; the contents of which are incorporated by reference herein.

FIELD OF THE RELATED ART

The present invention relates to a method for rewriting information of a memory IC card, and more particularly relates to a flash memory rewrite circuit which is used in the case of rewriting information data using a flash memory IC card, a semiconductor integrated circuit for an memory IC card, a memory IC card, a flash memory rewriting method, and a flash memory rewriting program.

BACKGROUND

FIG. 1 illustrates the structure of a large scale integrated device (LSI) 41 for an integrated circuit card (IC card) for general use. Though flash memory 14, serving as memory on LSI 41, is illustrated, an EEPROM and the like may be used in place of the flash memory 14 as illustrated in FIG. 2. First, an explanation will be given of a rewriting method in a case where an EEPROM 17 is used as memory of FIG. 2. A CPU 11 designates data and an address for a designated byte for rewriting in EEPROM 17 via a bus 10. Since the designated byte for rewriting data is directly designated by the CPU 11, data can be rewritten for each designated byte. However, since EEPROM 17 increases an area, EEPROM 17 cannot respond to the need for an increase in capacity in such a system that has a determined maximum chip area such as an IC card. Accordingly, EEPROM 17 is often used in an IC card of up to about 16 Kbytes. On the other hand, the LSI 41 using flash memory 14 as shown in FIG. 1 can respond to the need of an IC card up to about 128 Kbytes. However, since the flash memory 14 generally performs rewriting per block, an operation must be carried out according to a special flow in order to perform rewriting for each designated byte.

The rewriting method of flash memory 14 will be explained using a flowchart of FIG. 3 and FIG. 4 with reference to FIG. 1

(a) In step S301 of FIG. 3, page $P_m$ including designated byte $b_k$ for rewriting data in flash memory 14 is stored in RAM 12 from flash memory 14 via bus 10 according to an instruction from CPU 11. One page refers to a page that uses 64 bytes as one unit (block). In the flash memory, rewriting is generally carried out per block (page) in this way.

(b) Next, in step S302, data for designated byte $b_k$ for rewriting data is written over page data for page $P_m$ stored in RAM 12 via bus 10 according to an instruction from CPU 11. This overwritten new page data for page $P_m$ is data to be newly written to flash memory 14.

(c) Next, in step S303, new page data for page $P_m$ prepared in the RAM 12 is set at a page address of flash memory 14 via bus 10 according to an instruction from CPU 11.

(d) Next, in step S304, page data for page $P_m$ of the flash memory 14 is rewritten according to an instruction from CPU 11.

Problem arises in the EEPROM, because data and an address for a designated byte for rewriting are directly designated, so that rewriting can be carried out in one step. On the other hand the byte rewriting of flash memory needs the plurality of steps as discussed above. For this reason, program developers must create an application with consideration given to the way of handling data for all bytes corresponding to one page including rewriting portions even when designated data with several bytes are stored.

Furthermore especially, in the EEPROM, rewriting per byte can be carried out in one step but the capacity is small, while the flash memory can deal with the large capacity but needs several steps to perform rewriting per byte.

SUMMARY

According to an aspect of the present invention, a flash memory rewrite circuit including: a rewrite data control circuit, receiving a rewrite instruction of a flash memory from a CPU to store data for a designated byte of a page for rewriting to a memory block; a wait control circuit, generating and canceling a wait instruction to the CPU; a page data control circuit, sending data of the page excluding the designated byte to the memory block from the flash memory to prepare new page data in the memory block; and a data set control circuit that writes the new page data prepared in the memory block into the flash memory.

According to another aspect of the present invention, a flash memory rewriting method including: receiving a rewrite instruction of a flash memory from a CPU; storing data for a designated byte of a page for rewriting to a memory block; generating a wait instruction to said CPU; sending data of said page excluding the designated byte to said memory block from said flash memory to prepare new page data in said memory block; setting said new page data prepared in said memory block at an page address of said flash memory; rewriting data of said flash memory; and canceling said wait instruction to said CPU.

The features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are incorporated in and constitute a part of this specification, illustrate several embodiments and together with the description, serve to explain the principles of the invention. A more complete appreciation of the present invention and many of its attendant advantages will be readily obtained by reference to the following detailed description considered in connection with the accompanying drawings, in which:

FIG. 4 is a data flowchart illustrating the conventional flash memory rewriting method;

FIG. 5(a) is a block diagram illustrating a structure of an IC card according to an exemplary embodiment of the present invention;

FIG. 5(b) is an example of a cross-sectional view of the IC card explained in FIG. 5(a);

FIG. 10 is a flowchart of a flash memory rewriting method according to an exemplary embodiment of the present invention.

DETAILED DESCRIPTION OF THE EMBODIMENTS

Figure 1:
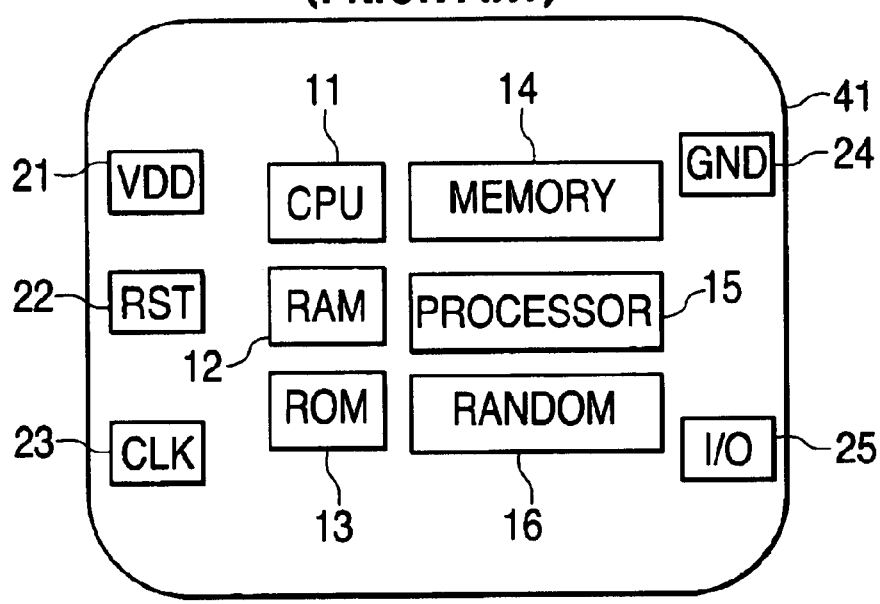
FIG. 1 is a block diagram illustrating a structure of the conventional IC card.
Figure 2:
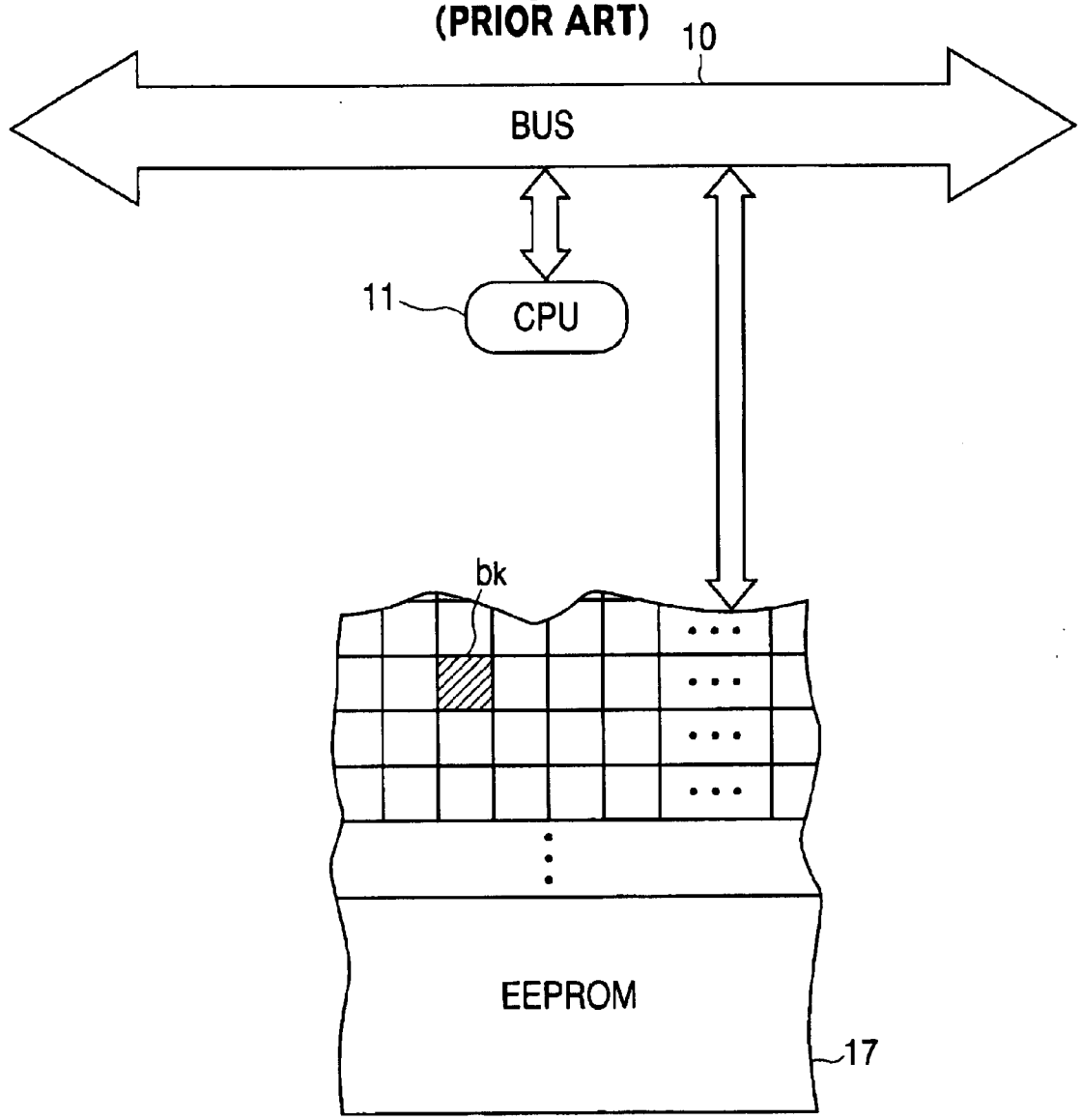
FIG. 2 is a data flowchart illustrating a conventional EEPROM rewriting method.

The present invention will be described by exemplary embodiments with reference to the drawings. In this description, similar elements are denoted by the same reference numerals throughout the drawings.

An exemplary of the present invention is described with reference to FIG. 5(a) to FIG. 7. FIG. 5(a) is a schematic plane view illustrating a structure of a memory IC card according to an exemplary of the present invention. In this embodiment, we call memory IC card as IC card. The IC card is a card mounting memory blocks (for example, EEPROM, FLASH MEMORY, DRAM, ROM, etc) and a control circuit on card substrate. The IC card is used, for example, a cash card, credit card, debit card, SIM (Subscribers Identity Module) card, USIM (Universal Subscribers Identity Module) card etc. Sometimes this type of card is called 'plastic'. This figure corresponds to a state in which an upper cover film 92 and a spacer 91 shown in FIG. 5(b) are eliminated. An IC card 100 comprises a card substrate 90, an LSI 40 for an IC card mounted on the card substrate 90, a VDD terminal 61, a RST terminal 62, a CLK terminal 63, an I/O terminal 64, and a GND terminal 65. Moreover, substrate wirings 71 to 75 are formed on the card substrate 90. In the LSI 40 for an IC card, a CPU 11, a RAM 12, a ROM 13, a flash memory 14, a coprocessor 15, a RANDOM 16, and a flash memory rewrite circuit 1 are integrated on a semiconductor chip. Moreover, a VDD terminal pad 21, a RST terminal pad 22, a CLK terminal pad 23, an I/O terminal pad24, and a GND terminal pad 25, which are bonding pads that respectively perform data exchange with terminals 61, 62, . . . , 65, are arranged at the peripheral portion of the semiconductor chip. As illustrated in FIG. 5(b), a spacer 91 is bonded to one surface side of the card substrate 90. The spacer 91 has a hollow portion to which the LSI 40 for an IC card is inserted, and the LSI 40 for an IC card is bonded to the card substrate 90 at the interior of the hollow portion of the spacer 91. In IC card 100, both surfaces of the card substrate 90 having LSI 40 for an IC card mounted thereon are respectively covered with the upper cover film 92 and lower cover film 93 so as to sandwich spacer 91. FIG. 5(b) is one example of IC cards, and, of course, other structure may be used.

CPU 11 performs control processing for providing a writing instruction to the flash memory rewrite circuit 1, and the like. RAM 12 is a memory for data processing. ROM 13 records a program, which is based on management definition, thereon. Flash memory 14 is nonvolatile memory, which can be electrically erased and rewritten per block, and which has larger capacity than EEPROM. Coprocessor 15 is a processor that handles an auxiliary function. A typical example for a coprocessor 15 is a floating point unit (FPU) that specially handles floating point operations. RANDOM 16 is control logic excepting CPU, RAM, ROM, etc.

VDD terminal pad 21 is a bonding pad that supplies power, and is connected to VDD terminal 61 via a substrate wiring 71 and a bonding wire 81. RST terminal pad 22 is a bonding pad that receives a reset signal, which resets the respective circuit blocks 1, 11, 12, . . . , 16 on the LSI to an initial state. The RST terminal pad 22 is connected to RST terminal 62 via a substrate wiring 72 and a bonding wire 82. CLK terminal pad 23 is a bonding pad that receives a periodic signal for synchronization to operate the respective circuit blocks 1, 11, 12, . . . , 16 on the LSI. CLK terminal pad 23 is connected to CLK terminal 63 via a substrate wiring 73 and a bonding wire 83. I/O terminal pad 24 is a bonding pad that receives a data I/O signal. I/O terminal pad 24 is connected to the I/O terminal 64 via a substrate wiring 74 and a bonding wire 84. The GND terminal pad 25 is a ground bonding pad for a signal (safety) and is connected to GND terminal 65 via a substrate wiring 75 and a bonding wire 85.

Figure 6:
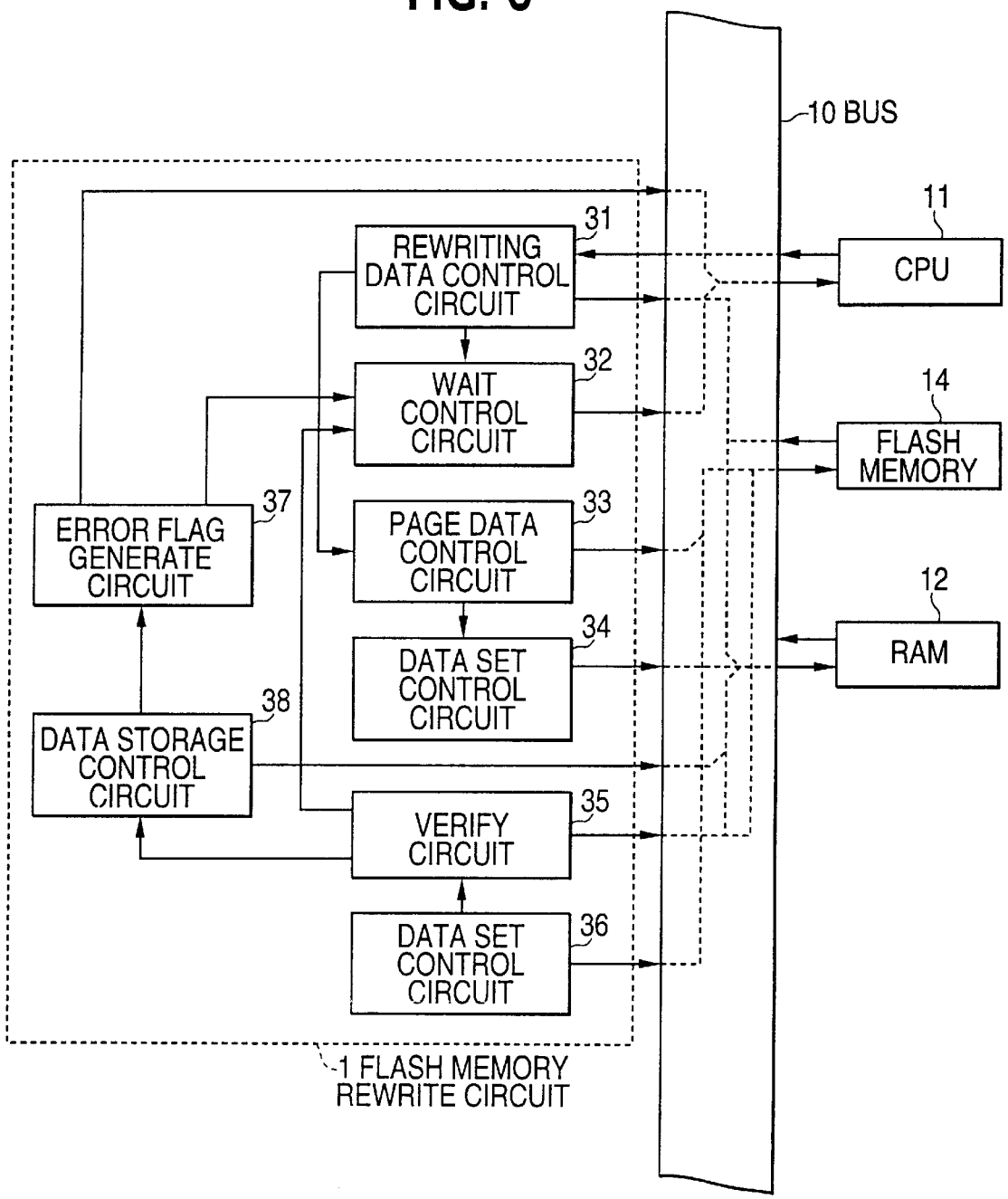
FIG. 6 is a block diagram of a flash memory rewrite circuit according to an exemplary embodiment of the present invention.

Flash memory rewrite circuit 1 comprises, as illustrated in FIG. 6, a rewriting data control circuit 31, a wait control circuit 32, a page data control circuit 33, a data set control circuit 34, a verify circuit 35, a data set end determine circuit 36, an error flag generate circuit 37, and a data storage control circuit 38.

Rewriting data control circuit 31 receives a rewrite instruction of the flash memory 14 from CPU 11 via a bus 10 and stores data for a designated byte for rewriting to RAM 12. Rewriting data control circuit 31 also instructs the wait control circuit 32 to generate a wait instruction to the CPU 11 and notifies the page data control circuit 33 that byte data has been stored in the RAM 12. Wait control circuit 32 performs generation and cancellation of the wait instruction to CPU 11. Page data control circuit 33 sends the RAM 12 data for bytes excepting the designated byte of a page to be rewritten in the flash memory 14 via bus 10 and store the data. The data set control circuit 34 rewrites new page data prepared in RAM 12 to flash memory 14 via bus 10. Data set end determinate circuit 36 monitors flash memory 14, and provides a notification to the verify circuit 35 when new data corresponding to one page is set and rewriting is ended. Verify circuit 35 compares the value of the flash memory 14 with that of RAM 12 via bus 10. When both values are different from each other, the verify circuit 35 provides a notification to the data storage control circuit 38, and when both values are the same as each other, verify circuit 35 provides a notification to the wait control circuit 32. Data storage control circuit 38 notifies the error flag generate circuit 37 of occurrence of an error, and stores error data and an address of the error data to RAM 12 via bus 10. Error flag generate circuit 37 notifies CPU 11 of the error flag, and instructs the wait control circuit 32 to cancel the wait instruction to CPU 11.

Figure 7:
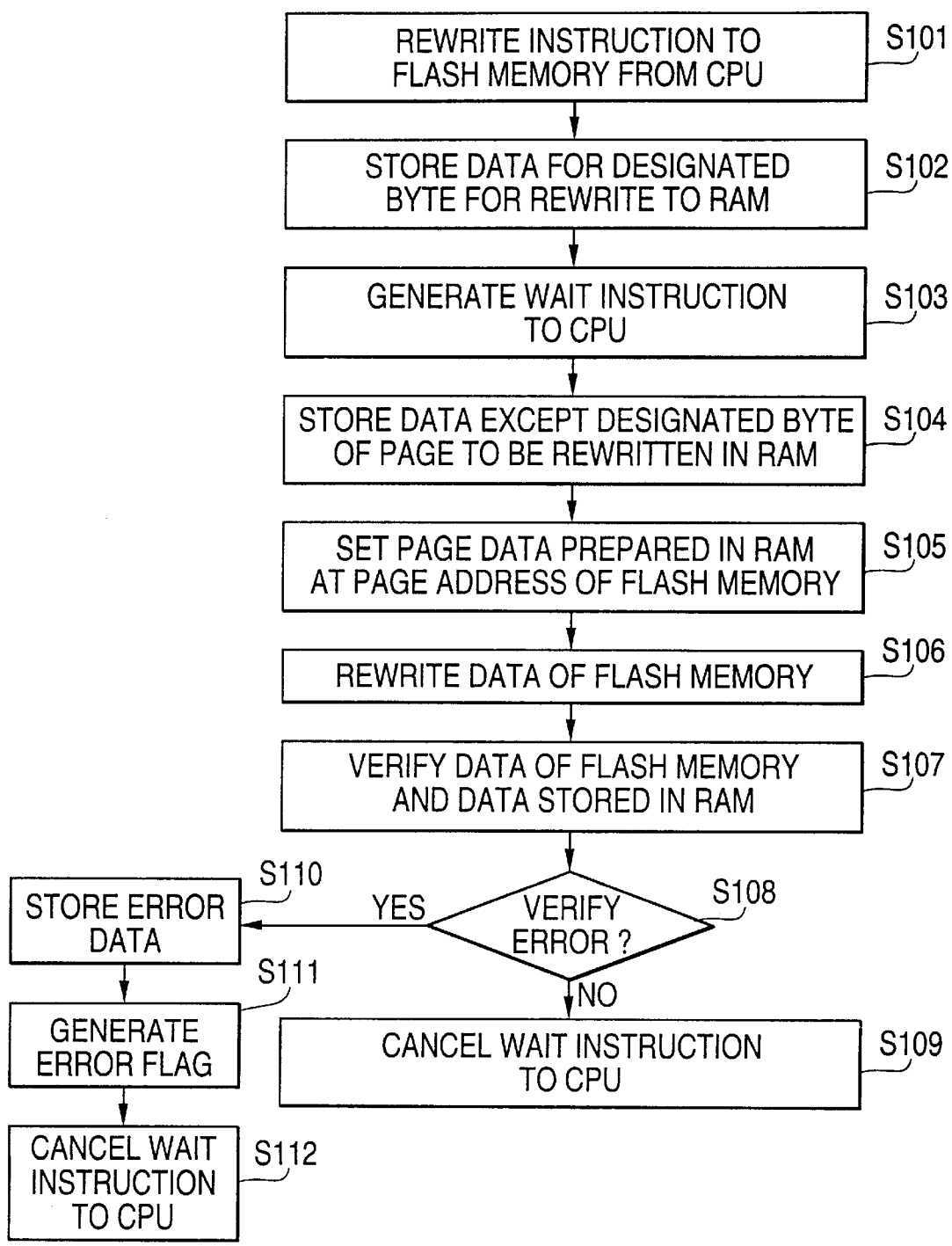
FIG. 7 is a flowchart of a flash memory rewriting method according to an exemplary embodiment of the present invention.
Figure 8:
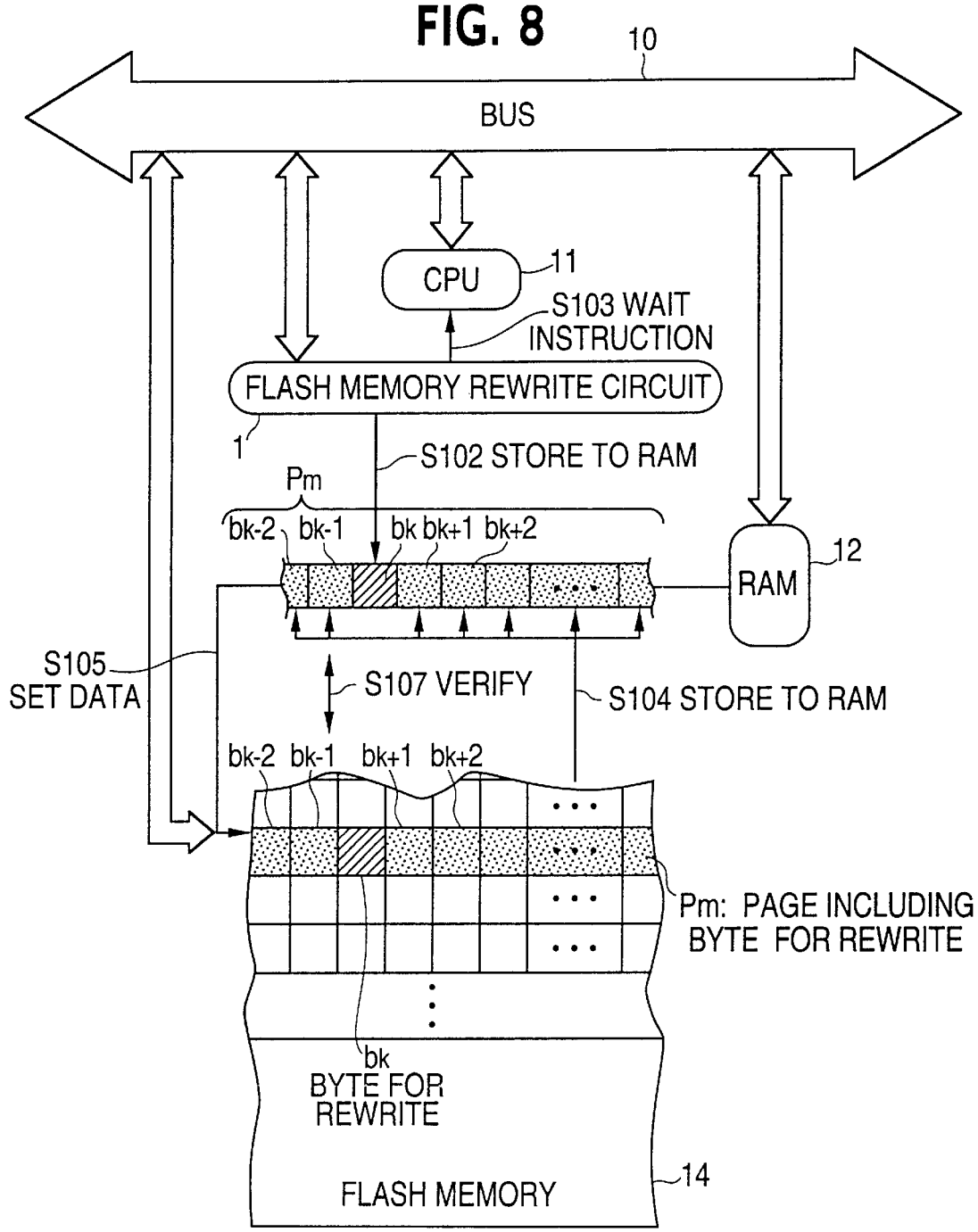
FIG. 8 is a data flowchart of a flash memory rewriting method according to an exemplary embodiment of the present invention.

An explanation will be given of the flash memory rewriting method with reference to FIGS. 7 and 8.

(a) First, CPU 11 determines whether rewriting by page unit is effective or rewriting by byte unit is effective based on the amount of rewriting data of the flash memory. The page unit herein refers to unit of block that handle fixed bytes as one batch. For example, 64 bytes are handled as one page. In the case where rewriting by page unit is selected, CPU 11 performs control to rewrite flash memory in a conventional way. In the case where rewriting by byte unit is selected, a rewrite instruction is transmitted to the rewrite data control circuit 31 of the flash memory rewrite circuit 1 from CPU 11 in step S101.

(b) Next, in step S102, the rewrite data control circuit 31, which has received the rewrite instruction from CPU 11, stores data for a designated byte for rewriting page $P_m$ to RAM 12 via the bus 10. In FIG. 8, byte $b_k$ that is shown by a diagonally shaded area is a designated byte for rewriting, and it is set to RAM 12 via the bus 10 by the flash memory rewrite circuit 1.

(c) Next, rewrite data control circuit 31 instructs wait control circuit 32 to generate a wait instruction to CPU 11. In step S103, wait control circuit 32 generates a wait instruction to CPU11. This stops the operation of CPU 11 until a wait cancellation instruction is given. FIG. 8 illustrates step (S103) where the generation of wait instruction to the CPU 11 occurs from flash memory rewrite circuit 1.

(d) Next, in step S104, the page data control circuit 33 sends page $P_m$ including a byte for rewriting data in flash memory 14 to the RAM 12 via the bus 10 and stores the data. At this time, data of storing page Pm includes no data for a designated byte $b_k$ for rewriting data. Namely, in FIG. 8, only data for bytes . . . , $b_{k-2}$, $b_{k-1}$, $b_{k+1}$, $b_{k+2}$, . . . of dotted portions of page data is set to RAM 12. Resultantly, new page data for page $P_m$ in which data for byte $b_k$ is replaced with the data stored in step S102 is prepared in the RAM 12.

(e) Next, in step S105, data set control circuit 34 sets new page data for page $P_m$ prepared in RAM 12 at a page address of the flash memory. Then, in step S106, in the flash memory 14, data rewriting to new page data for page $P_m$ is carried out.

(f) Data set end determinate circuit 36 monitors the flash memory 14, and provides a notification to the verify circuit 35 when new data is set. In step S106, since data rewriting to new page data for page $P_m$ is carried out in the flash memory 14, data set end determinate circuit 36 provides a notification to verify circuit 35. In step S107, verify circuit 35 compares the data of the flash memory 14 with that of the RAM 12.

(g) In step S108, when the value of the flash memory 14 is different from that of the RAM 12, a verify error occurs. In this case, the processing goes to step S110, and the verify circuit 35 provides a notification to the data storage control circuit 38. In step S110, the data storage control circuit 38 stores the error data and an address of the error data to the RAM 12 via the bus 10. Then, the data storage control circuit 38 provides a notification to error flag generate circuit 37. In step S111, the error flag generate circuit 37 generates an error flag to CPU 11, and instructs wait control circuit 32 to cancel the wait instruction. After that, in step S112, the wait control circuit 32 cancels the wait instruction to CPU 11.

(h) While, in step S108, when the value of the flash memory 14 is the same as that of the RAM 12, no verify error occurs and the verify circuit 35 provides a notification to the wait control circuit 32. After that, in step S109, the wait control circuit 32 cancels wait instruction to CPU 11.

When the rewriting of flash memory is carried out by use of the flash memory rewrite circuit according to the first embodiment, the CPU can carry out the rewriting only by providing a rewrite instruction to the flash memory rewrite circuit. In this way, similar to the rewriting of the conventional EEPROM, it is possible to carry out the rewriting of flash memory in one step in which CPU 11 provides the rewrite instruction. This makes it possible for the application program developers to rewrite the flash memory per byte in one step and to shorten the developing procedures. Moreover, when the verify error occurs, the flash memory rewrite circuit according to the first embodiment makes it possible to store verify error data and an address of the verify error data to the RAM and to notify the CPU of occurrence of error.

An IC card of an exemplary embodiment is one in which an ECC circuit is built in the flash memory of the IC card of the first embodiment.

Figure 9:
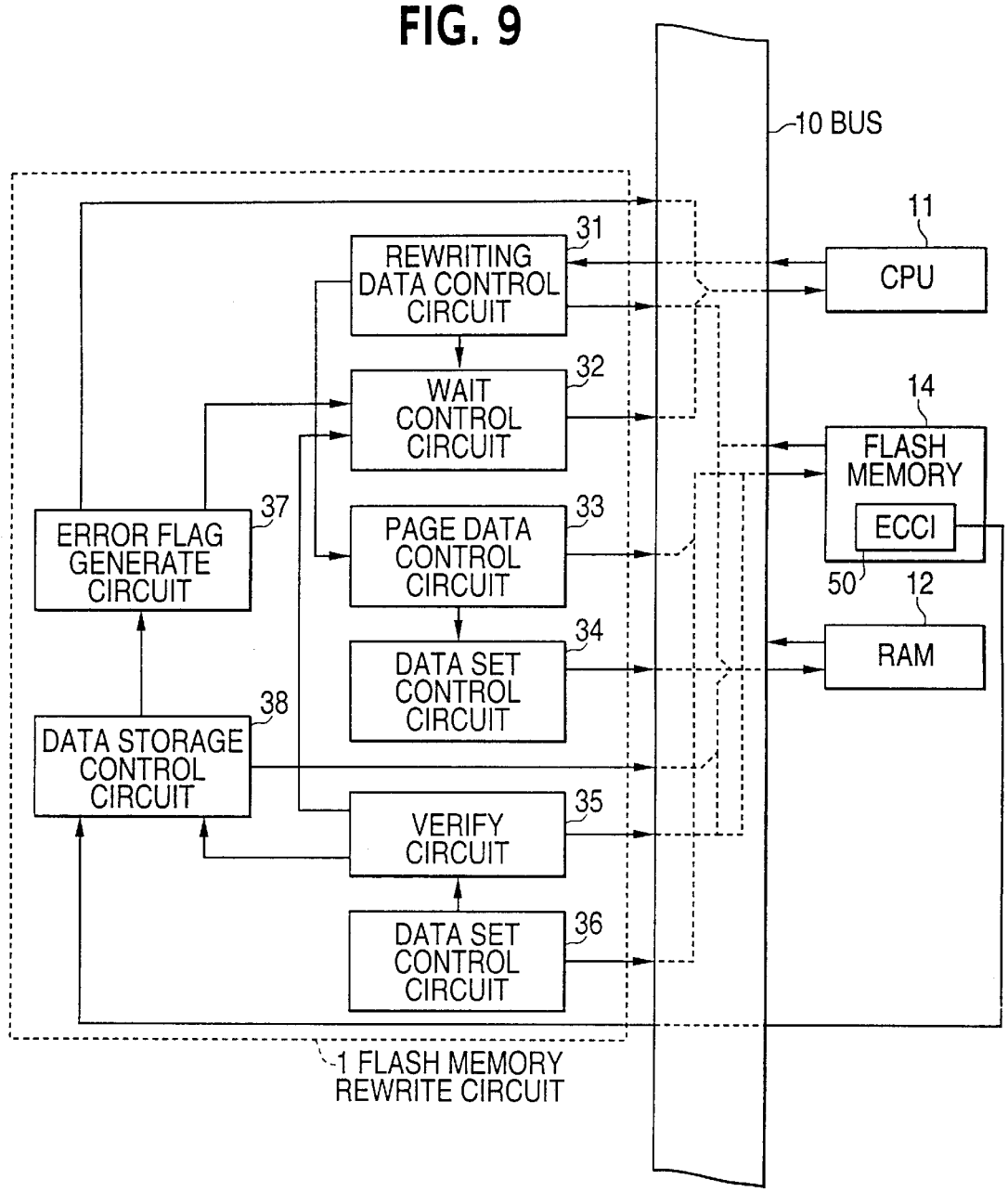
FIG. 9 is a block diagram of a flash memory rewrite circuit according to an exemplary embodiment of the present invention.

FIG. 9 illustrates a block diagram of a flash memory rewrite circuit according to the exemplary embodiment. The flash memory rewrite circuit 1 shown in FIG. 9 comprises a rewriting data control circuit 31, a wait control circuit 32, a page data control circuit 33, a data set control circuit 34, a verify circuit 35, a data set end determine circuit 36, an error flag generate circuit 37, and a data storage control circuit 38. Since these components are the same as those explained in the first embodiment, the explanation will be omitted.

Flash memory 14 of the IC card according to the exemplary embodiment has an ECC circuit 50 built-in. ECC circuit 50 performs memory error detection. In the case of one-bit error, ECC circuit 50 can specify a location where the error occurs and correct it to a correct value. However, in the case of two-bit error, ECC circuit 50 cannot correct it. Accordingly, ECC circuit 50 generates a signal indicative of two bit error. In the flash memory rewrite circuit 1, error flag generate circuit 37 receives this two-bit error signal.

An explanation will be given of the flash memory rewriting method according to this exemplary embodiment with reference to FIG. 10.

Figure 3:
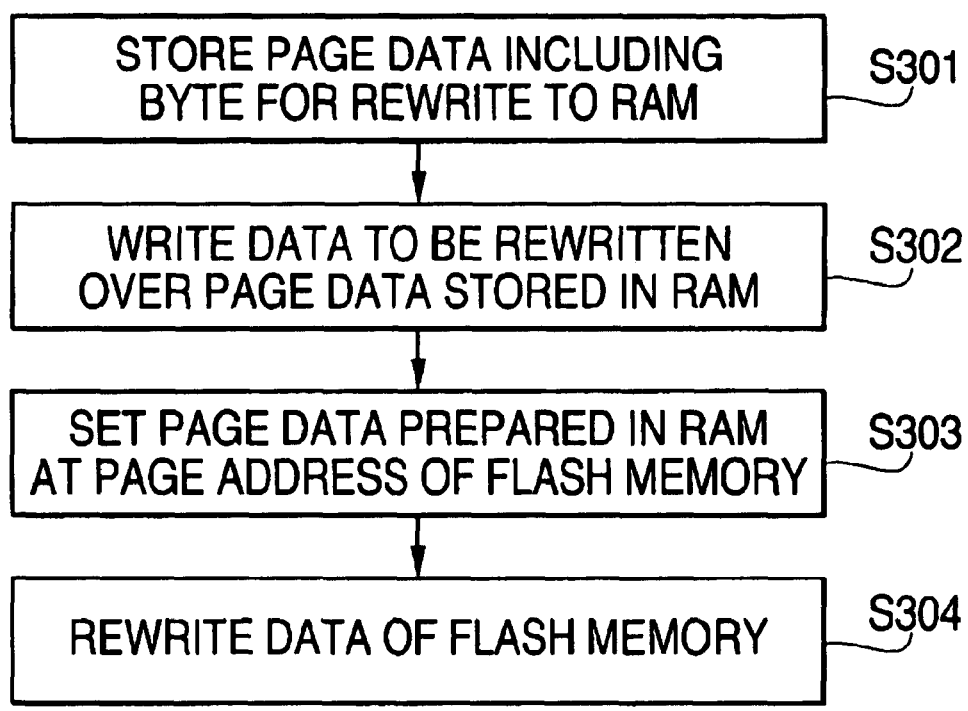
FIG. 3 is a flowchart illustrating a conventional flash memory rewriting method.

(a) Steps S201 to S203 are the same as steps S101 to S103 shown with respect to the exemplary of FIG. 3.

(b) In step S204, when page data control circuit 33 reads data in flash memory 14, the ECC circuit 50 verifies the presence or absence of data error. In the case of the one-bit error, the ECC circuit 50 automatically corrects the error value to a correct value. When a two-bit error occurs, the ECC circuit 50 cannot correct the error, so that processing goes to step S211. In step S211, data storage control circuit 38 receives a two-bit error signal from the ECC circuit 50 and stores the error data and an address of the error data to the RAM 12, and notifies the error flag generate circuit 37 of occurrence of error. In step S212, the error flag generate circuit 37 generates an error flag to CPU 11, and instructs the wait control circuit 32 to cancel the wait instruction. Thereafter, in step S213, the wait control circuit 32 cancels the wait instruction to the CPU 11.

(c) In step S204, in a case where no two-bit error occurs, the processing goes to step S205 and the page data control circuit 33 sends a page including a byte for rewriting data in flash memory 14 to RAM 12 and stores it.

(d) Processing in steps S206 to S210 is the same as the processing in steps S105 to 109 described with reference to FIG. 7 of the first embodiment, the explanation will be omitted.

In the IC card according to the exemplary embodiment, when the two-bit error occurs in the case of using the flash memory having the ECC circuit built-in, the error data and an address of the error data are stored and the notification of error is sent to CPU 11. This makes it possible to stop the writing when the two-bit error occurs.

Though the present invention is described by the aforementioned first and second embodiments, the description and drawings that constitute the part of this disclosure does not limit this invention. From this disclosure, various alternative modifications and embodiments and operational techniques are obvious to one skilled in the art.

For example, the flash memory rewrite circuit according to the first and exemplary embodiments of the present invention includes a plurality of circuits. However, a circuit in which functions of two or more circuits are integrated into one may be used, and conversely, the function of one circuit may be divided into two or more circuits.

In the flash memory rewriting method according to the exemplary embodiments of the present invention, the description was provided for 64 bytes included in one page. However, various values may be taken depending on the characteristic of flash memory without limiting the number of bytes included in one page to 64 bytes.

The above description was given based on a flash memory rewriting method according to exemplary embodiments were executed in the sequence illustrated in FIG. 3 or FIG. 6. However, timing with which the wait instruction to CPU is generated and timing with which error data is stored at an error generating time are not limited to the above-explained sequence if no trouble occurs in the flow of rewriting.

The flash memory rewriting method according to the exemplary embodiments of the present invention was explained based on the number of bytes for rewriting was one byte. However, the number of bytes for rewriting data at once may be 3 bytes or 10 bytes if the bytes are in the same page. In this case, the number of bytes for rewriting is recognized by the rewrite data control circuit.

In this way, the present invention, of course, includes various embodiments, which are not described herein. Accordingly, the technical scope of the present invention is fixed by only reasonable matters to define the invention relating to the claims from the above description.

According to the present invention, there can be provided a flash memory rewrite circuit which is capable of rewriting flash memory in bytes in one step, an LSI for an IC card having the flash memory rewrite circuit, an IC card, a flash memory rewriting method, and a flash memory rewriting program.

What is claimed is:

1. A flash memory rewrite circuit comprising:
    a rewrite data control circuit, receiving a rewrite instruction of a flash memory from a CPU to store data for a designated byte of a page for rewriting to a memory block;
    a wait control circuit, generating and canceling a wait instruction to the CPU;
    a page data control circuit, sending data of the page excluding the designated byte to the memory block from the flash memory to prepare new page data in the memory block; and
    a data set control circuit that writes the new page data prepared in the memory block into the flash memory.

2. The flash memory rewrite circuit according to claim 1, further comprising:
    a verify circuit, that compares the flash memory with page data of the memory block;
    a data storage control circuit, that stores data verified as a verify error by the verify circuit and an address of the data to the memory block; and
    an error flag generating circuit, that notifies the CPU of an error flag when the verify error occurs.

3. The flash memory rewrite circuit according to 2, wherein the data storage control circuit stores two-bit error data due to an ECC circuit in the flash memory and an address of the two-bit error data to the RAM, and the error flag generating circuit notifies the CPU of the error flag when the two-bit error occurs.

4. A semiconductor integrated circuit comprising:
    a substrate;
    a CPU on the substrate;
    a flash memory on the substrate;
    a memory block on the substrate; and
    a flash memory rewrite circuit, which rewrites the flash memory per byte, the flash memory rewrite circuit including a rewrite data control circuit that receives a rewrite instruction of the flash memory from the CPU to store data for a designated byte of a page for rewriting to the memory block, a page data control circuit that sends data of the page excluding the designated byte of a page for rewriting to in the flash memory to the memory block to prepare new page data in the memory block, and a data set control circuit that writes the new page data prepared in the memory block to the flash memory.

5. The semiconductor integrated circuit according to claim 4, further comprising:
    a verify circuit, that compares the flash memory with page data of the memory block;
    a data storage control circuit, that stores data verified as a verify error by the verify circuit and an address of the data to the memory block; and
    an error flag generating circuit, that notifies the CPU of an error flag when the verify error occurs.

6. The semiconductor device according to claim 5, wherein the flash memory includes an ECC circuit, and the flash memory rewrite circuit receives a two-bit error signal from the ECC circuit.

7. A memory card comprising:
    a card substrate;
    a semiconductor integrated circuit mounted on the card substrate, which includes an CPU, a flash memory, a memory block and a flash memory rewrite circuit having a rewrite data control circuit that receives a rewrite instruction of the flash memory from the CPU to store data for a designated byte of a page for rewriting to the memory block, a page data control circuit that sends data of the page excluding the designated byte in the flash memory to the memory block to prepare new page data in the memory block and a data set control circuit that writes the new page data prepared in the memory block to the flash memory;
    outer terminals mounted on the card substrate; and
    wiring provided on the card substrate to connect the outer terminals to the semiconductor integrated circuit.

8. The memory card according to claim 7, wherein the flash memory rewrite circuit further comprising:
    a verify circuit, compares the flash memory with page data of the memory block;
    a data storage control circuit, that stores data verified as a verify error by the verify circuit and an address of the data to the memory block; and
    an error flag generating circuit, that notifies that CPU of an error flag when the verify error occurs.

9. The memory card according to claim 8, wherein the flash memory on the semiconductor integrated circuit has an ECC circuit, and the semiconductor integrated circuit receives a two-bit error signal from the ECC circuit.

10. A flash memory rewriting method comprising:
receiving a rewrite instruction of a flash memory from a CPU;
storing data for a designated byte of a page for rewriting to a memory block;
generating a wait instruction to the CPU;
sending data of the page excluding the designated byte to the memory block from the flash memory to prepare new page data in the memory block;
setting the new page data prepared in the memory block at an page address of the flash memory; and
rewriting data of the flash memory; and
canceling the wait instruction to the CPU.

11. The flash memory rewriting method according to claim 10, wherein the memory rewriting method further comprising; comparing the flash memory with page data of the memory block.

12. The flash memory rewriting method according to claim 11, wherein when the flash memory after being subjected to the rewriting is different from page data of the memory block, the flash memory rewriting method further comprising:
storing the different data and an address of the different data to the memory block;
generating an error flag to the CPU; and
canceling the wait instruction to the CPU.

13. The flash memory rewriting method of claim 11, wherein when a two-bit error is generated, the flash memory rewriting method, further comprising:
storing an error data and an address of the error data to the RAM;
generating an error flag to the CPU; and
canceling the wait instruction to the CPU.

14. A flash memory rewrite program, for controlling a flash memory rewrite circuit to which a CPU, a flash memory, and a memory block are respectively connected via a bus, comprising:
an instruction to receive a rewrite instruction of the flash memory from the CPU;
an instruction to store data for a designated byte of a page for rewriting to the memory block;
an instruction to generate a wait instruction to the CPU;
an instruction to send data of the page excepting the designated byte to the memory block from the flash memory to prepare new page data in the memory block;
an instruction to rewrite data of the flash memory; and
an instruction to cancel the wait instruction to the CPU.

15. The flash memory rewrite program according to claim 14, further comprising an instruction to compare the flash memory after being subjected to the rewriting with data of the memory block.

16. The flash memory rewrite program according to claim 14, wherein when the flash memory after being subjected to the rewriting is different from data of the memory block, the flash memory rewrite program further comprises:
an instruction to store the different data and an address of the different data to the memory block;
an instruction to generate an error flag to the CPU; and
an instruction to cancel the wait instruction to the CPU.

17. The flash memory rewrite program according to any one of claim 14, wherein when a two-bit error is generated from an ECC circuit provided in the flash memory upon reading data in the flash memory, the flash memory rewrite program further comprises:
an instruction to store an error data and an address of the error data to the memory block;
an instruction to generate an error flag to the CPU; and
an instruction to cancel the wait instruction to the CPU.

18. A semiconductor integrated circuit for memory card comprising:
a semiconductor substrate;
a CPU on the semiconductor substrate;
a flash memory on the semiconductor substrate;
a memory block on the semiconductor substrate; and
a means for rewriting the flash memory, which rewrites the flash memory per byte, the means for rewriting the flash memory further comprising:
a means for receiving a rewrite instruction of the flash memory from the CPU to store data for a designated byte of a page for rewriting to the memory block:
a means for sending data of the page excluding the designated byte in the flash memory to the memory block to prepare new page data in the memory block and;
a means for writing the new page data prepared in the memory block to the flash memory.

19. The semiconductor integrated circuit according to claim 18, further comprising:
a means for verifying, that compares the flash memory with page data of the memory block;
a means for controlling, that stores data verified as a verify error by the verify circuit and an address of the data to the memory block; and
a means for generating an error flag, that notifies the CPU of an error flag when the verify error occurs.

20. The semiconductor integrated circuit according to claim 18, wherein the flash memory includes an ECC circuit, and the flash memory rewrite circuit receives a two-bit error signal from the ECC circuit.

21. The semiconductor integrated circuit according to claim 18, wherein the memory block is RAM.

22. The semiconductor device according to claim 18, wherein the memory block is latch circuit.

23. A memory card comprising:
a semiconductor substrate;
a CPU on the semiconductor substrate;
a flash memory on the semiconductor substrate;
a memory block on the semiconductor substrate; and
a means for rewriting the flash memory, which rewrites the flash memory per byte, the a means for rewriting the flash memory further comprising:
a means for receiving a rewrite instruction of the flash memory from the CPU to store data for a designated byte of a page for rewriting to the memory block:
a means for sending data of the page except for the designated byte in the flash memory to the memory block to prepare new page data in the memory block and;
a means for writing the new page data prepared in the memory block to the flash memory.

24. The memory card according to claim 23, the means for rewriting the flash memory further comprising:
a means for verifying, that compares the flash memory with page data of the memory block;
a means for controlling, that stores data verified as a verify error by the verify circuit and an address of the data to the memory block; and
an means for generating an error flag, that notifies the CPU of an error flag when the verify error occurs.

* * * * *